(12) United States Patent
Kaneya et al.

(10) Patent No.: US 8,148,204 B2
(45) Date of Patent: Apr. 3, 2012

(54) CIRCUIT CONNECTION STRUCTURE, METHOD FOR PRODUCING THE SAME AND SEMICONDUCTOR SUBSTRATE FOR CIRCUIT CONNECTION STRUCTURE

(75) Inventors: Yuichi Kaneya, Hitachi (JP); Toshiaki Tanaka, Tsukuba (JP); Toshiaki Itabashi, Tokyo (JP)

(73) Assignees: Hitachi Chemical Dupont Microsystems, Ltd., Tokyo (JP); Hitachi Chemical Company, Ltd., Tokyo (JP)

( * ) Notice: Subject to any disclaimer, the term of this patent is extended or adjusted under 35 U.S.C. 154(b) by 469 days.

(21) Appl. No.: 12/064,522

(22) PCT Filed: Aug. 22, 2006

(86) PCT No.: PCT/JP2006/316359
§ 371 (c)(1),
(2), (4) Date: Feb. 22, 2008

(87) PCT Pub. No.: WO2007/023781
PCT Pub. Date: Mar. 1, 2007

(65) Prior Publication Data
US 2009/0189254 A1 Jul. 30, 2009

(30) Foreign Application Priority Data
Aug. 22, 2005 (JP) .................................. 2005-240204

(51) Int. Cl.
*H01L 21/44* (2006.01)
*H01L 21/48* (2006.01)
(52) U.S. Cl. ........................................ 438/118; 438/455
(58) Field of Classification Search .................. 438/118, 438/455; 257/E21.499, E21.122, E21.492, 257/E21.496
See application file for complete search history.

(56) References Cited

U.S. PATENT DOCUMENTS

| 4,971,667 | A | 11/1990 | Yamazaki et al. |
| 6,605,175 | B1 | 8/2003 | Ramm et al. |
| 2003/0049937 | A1* | 3/2003 | Suzuki et al. ................. 438/714 |

(Continued)

FOREIGN PATENT DOCUMENTS

JP 55-104007 A 8/1980

(Continued)

OTHER PUBLICATIONS

International Search Report (PCT/ISA/210) issued in the corresponding Japanese Application No. PCT/JP2006/316359 completed Sep. 11, 2006 and mailed Sep. 19, 2006.

(Continued)

*Primary Examiner* — Hung Vu
(74) *Attorney, Agent, or Firm* — Griffin & Szipl, P.C.

(57) ABSTRACT

A circuit connection structure that exhibits excellent adhesiveness between a heat resistant resin film and a circuit adhesive member, even under high temperature and high humidity, is provided by introducing a chemically stable functional group into the heat resistant resin film by additional surface treatment to improve adhesiveness. In a circuit connection structure, a semiconductor substrate and a circuit member are adhered by a circuit adhesive member sandwiched therewith. First circuit electrode on the semiconductor substrate and second circuit electrode on the circuit member are connected electrically by conductive particles in the circuit adhesive member. A surface modification is given to the semiconductor substrate by plasma treatment using gas containing nitrogen, ammonia and the like. Therefore, the heat resistant resin film on the semiconductor substrate and the circuit adhesive member are firmly adhered for a long period of time even under high temperature and high humidity.

10 Claims, 3 Drawing Sheets

U.S. PATENT DOCUMENTS

2004/0001957 A1    1/2004   Seita et al.

FOREIGN PATENT DOCUMENTS

| | | |
|---|---|---|
| JP | 59-158531 A | 9/1984 |
| JP | 60-262430 A | 12/1985 |
| JP | 03-028365 A | 2/1991 |
| JP | 3-225993 A | 10/1991 |
| JP | 7-94540 A | 4/1995 |
| JP | 11-191576 A | 7/1999 |
| JP | 2001044233 A | 2/2001 |
| JP | 2002-537641 A | 11/2002 |
| JP | 2003-073862 A | 3/2003 |
| JP | 2003-163451 | 6/2003 |
| JP | 2003-163451 A | 6/2003 |
| JP | 2005-183599 | 7/2005 |
| JP | 2006-005302 A | 1/2006 |
| JP | 2006-156869 A | 6/2006 |
| TW | 462904 B | 11/2001 |
| WO | 2007-023781 A1 | 3/2007 |

OTHER PUBLICATIONS

Yuichi Satsu et al., Effect of Plasma Treatment on Adhesion of Low Thermal Expansion Polymide Films, The IEICE (Institute of Electronics, Information and Communication Engineers), 1991, pp. 489-497, vol. J74-C-II, No. 6, Japan.

Yuichi Satsu et al., Fundamental Study on the high adhesion technique of the low thermal expansion polymide with metals, Polymer Reprint, 1989, pp. 3708-3710, vol. 38, No. 11, Japan.

Chinese Office Action No. 200680030441X dated Jan. 9, 2009.

Second Chinese Office Action, issued in corresponding Chinese Application No. 200680030441.X, completed Oct. 16, 2009, with partial English translation, 9 pages.

Office Action issued in co-pending U.S. Appl. No. 12/064,511, mailed Sep. 16, 2010.

Luo et al., "Improvement of Epoxy Adhesion to Polyimide Passivation," 2002 Electronic Components and Technology Conference, pp. 1390-1395.

Japanese Office Action with partial english translation issued in corresponding Japanese Application No. 2005-240204, dated Nov. 24, 2010.

Office Action issued in co-related U.S. Appl. No. 12/064,511, mailed Mar. 23, 2011.

M.H. Bernier et al., "Polymer Surface Modification by Dual-Frequency Plasma Treatment," Nov. 9, 1990, American Chemical Society: Metallization of Polymers, pp. 146-160.

Final Office Action dated Oct. 25, 2011 in co-pending U.S. Appl. No. 12/064,511.

Office Action issued on Nov. 1, 2011 in corresponding Japanese Patent Application No. 2005-239610.

* cited by examiner

CIRCUIT CONNECTION STRUCTURE, METHOD FOR PRODUCING THE SAME AND SEMICONDUCTOR SUBSTRATE FOR CIRCUIT CONNECTION STRUCTURE

This is a National Phase Application in the United States of International Patent Application No. PCT/JP2006/316359 filed Aug. 22, 2006, which claims priority on Japanese Patent Application No. 2005-240204, filed Aug. 22, 2005. The entire disclosures of the above patent applications are hereby incorporated by reference.

TECHNICAL FIELD

The present invention relates to a circuit connection structure used for liquid crystal displays, a method for producing the same and a semiconductor substrate for the circuit connection structure. More particularly, the present invention relates to a circuit connection structure where a semiconductor substrate and a circuit member are adhered and electrically connected via a circuit adhesive member, a method for producing the same and a semiconductor substrate for the circuit connection structure.

BACKGROUND ART

As semiconductor chips and electronic parts are required to be configured in small and thin size, and as high-definition liquid crystal displays have been developed, circuits and electrodes therefor are required to have high density and high definition. It is difficult to connect such microelectrodes by soldering. Thus, recently the microelectrodes have been often connected using an adhesive.

There are some methods for connecting electrodes using the adhesive. In one of such methods, an anisotropic conductive adhesive or film containing conductive particles such as particles of carbon, nickel or metal-coated plastic in an insulative adhesive is pressed with heat to produce an ACF (=anisotropic conductive film) which gives electrical connection in a thickness direction of the adhesive (Patent Document 1, the method may be referred to hereinbelow as ACF). In another method, in the absence of the electroconductive particles, concavo-convex shapes of the electrode surface were directly contacted upon applying pressure on NCF (non-conductive film), to thereby establishing electrical connection (Patent Document 2, the method may be referred to hereinbelow as NCF).

In recent years, for electrode semiconductor substrates with ACF connection, a liquid crystal driver IC has been mounted by a COG (chip on glass) system or a COF (chip on flexible print circuit board) system. On a surface of such driver IC, a heat resistant resin composition such as a polyimide film or a polybenzoxazole film is widely used. The heat resistant resin composition and the adhesive film such as ACF and NCF have to be adhered with an excellent adhesiveness. Particularly, such chips are required to keep highly reliable adhesiveness after being mounted even in a thermal shock cycle resistance test and a high temperature high humidity test.

As a procedure to enhance the adhesiveness between the heat resistant resin polyimide film and ACF, Patent Document 3 discloses technology for enhancing the adhesiveness by treating the polyimide film with plasma. Patent Document 4 also discloses the technology for enhancing the adhesiveness by treating the polyimide film with plasma at low temperature.

Patent Document 1: JP Sho-55-104007-A
Patent Document 2: JP Sho-60-262430-A
Patent Document 3: JP 2003-73862-A
Patent Document 4: JP 2003-163451-A

DISCLOSURE OF INVENTION

Problem to be Solved by the Invention

However, in Patent Document 3, the gas for the treatment specifically disclosed is oxygen only, and there is no description concerning the highly reliable adhesiveness in the thermal shock cycle resistance test and the high temperature high humidity test of the mounted chip. In Patent document 4, the type of the gas for the treatment specifically disclosed is oxygen only, and there is no description concerning the highly reliable adhesiveness in the thermal shock cycle resistance test and the high temperature high humidity test of the mounted chip. In fact, an effect of improving this adhesiveness for a long period of time can not be accomplished with oxygen treatment.

The present invention has been made for solving conventional problems as mentioned above. The object of the present invention is to provide a circuit connection structure which can exhibit the excellent adhesiveness between a heat resistant resin composition and a circuit adhesive member even when used under high temperature and high pressure not through improving the adhesiveness by physically providing roughness on the surface of the heat resistant composition or making the surface hydrophobic to prevent moisture uptake deterioration, but through improving the adhesiveness by introducing a chemically stable functional group into a heat resistant resin film with an additional surface treatment. The present invention also provides a method for producing the same, and a semiconductor substrate for the circuit connection structure.

Means for Solving Problem

In order to solve the aforementioned problem and achieve the objective, the method for producing a circuit connection structure of the present invention comprises: a step of surface modification by giving a plasma treatment to a semiconductor substrate having a heat resistant resin film and a first circuit electrode on a surface thereof, using a nitrogen-based gas containing at least one selected from the group consisting of nitrogen, ammonia and hydrazine; a step of arranging the semiconductor substrate whose surface has been modified and a circuit member having a second circuit electrode to be opposed to the first circuit electrode, so that the first circuit electrode is opposed to the second circuit electrode with a circuit adhesive member interposed therebetween; and a step of bonding the semiconductor substrate and the circuit member with pressure, to adhere the semiconductor substrate and the circuit member for establishing mutual electrical connection between the first circuit electrode and the second circuit electrode.

According to the method for producing the circuit connection structure of the present invention, the circuit adhesive member may comprise conductive particles and the first circuit electrode and the second circuit electrode are connected electrically through the conductive particles.

According to the method for producing the circuit connection structure of the present invention, the nitrogen-based gas may be a mixed gas further comprising hydrogen or an inert gas.

According to the method for producing the circuit connection structure of the present invention, a ratio of the nitrogen-based gas may be 20 to 100% by volume relative to the mixed gas.

According to the method for producing the circuit connection structure of the present invention, the heat resistant resin film may be a film composed of a copolymer of at least two selected from the group consisting of polyamide, polyimide, polyamideimide, polybenzoxazole, polybenzimidazole and benzocyclobutene, or at least one precursor of a polymer selected from the group.

According to the method for producing the circuit connection structure of the present invention, the plasma treatment may be performed at a pressure in the range of 0.5 Pa to normal pressure.

According to the method for producing the circuit connection structure of the present invention, the semiconductor substrate may be a semiconductive device.

According to the method for producing the circuit connection structure of the present invention, the circuit member may be a glass substrate, a metal substrate or a ceramic substrate.

According to the method for producing the circuit connection structure of the present invention, the circuit adhesive member may be an adhesive film or an adhesive paste.

According to the method for producing the circuit connection structure of the present invention, the adhesive film or adhesive paste may contain an epoxy-based resin.

The circuit connection structure of the present invention is produced by the aforementioned method for producing the circuit connection structure.

The semiconductor substrate for a circuit connection structure of the present invention has a heat resistant resin film and a first circuit electrode on a surface thereof, a surface modification having been given to the substrate by plasma treatment using a nitrogen-based gas containing at least one selected from the group consisting of nitrogen, ammonia and hydrazine.

Effect OF THE Invention

According to the present invention, a surface modification treatment is given to the semiconductor substrate by treating the same with plasma. Thus, the adhesiveness between the heat resistant resin film formed on the surface of the semiconductor substrate and the circuit adhesive member, particularly the adhesive film containing an epoxy-based resin is enhanced. Therefore, the good adhesiveness can be kept for a long period of time even under high temperature and high humidity, and the circuit connection structure having high reliability can be produced.

EXPLANATIONS OF LETTERS OR NUMERALS 1A, 1B Circuit connection structure
2 Semiconductor substrate
3 Circuit member
4 Circuit adhesive member
5 Heat resistant resin film
6 First circuit electrode
7 Second circuit electrode
8 Conductive particle

BEST MODE FOR CARRYING OUT THE INVENTION

Embodiments of the circuit connection structure, the method for producing the same and the semiconductor substrate for the circuit connection structure according to the present invention will be described in detail below referring to the drawings. The present invention is not limited by the embodiments.

(Embodiment 1 )

Figure 1:
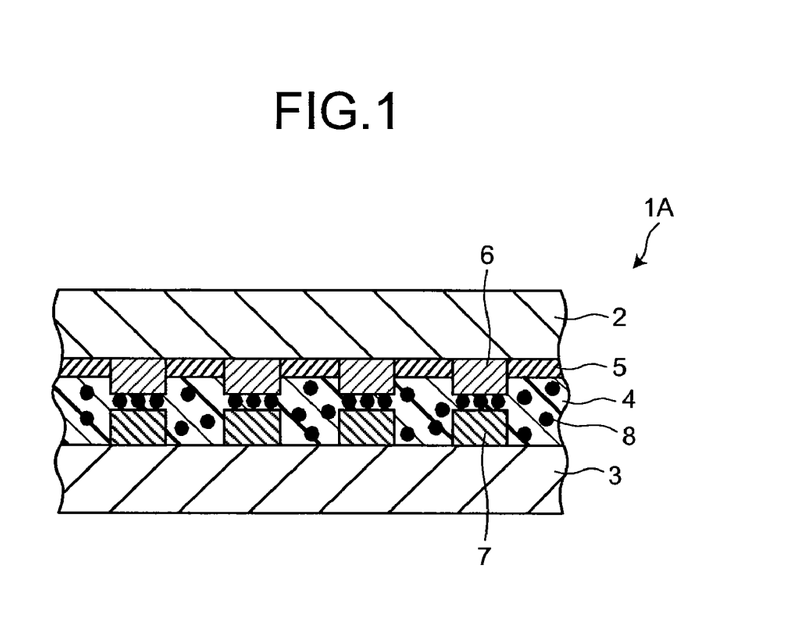
FIG. 1 is a schematic sectional view showing a circuit connection structure according to Embodiment 1 of the present invention.

FIG. 1 is a schematic sectional view of the circuit connection structure according to Embodiment 1 of the present invention. With Embodiment 1, the case of using an anisotropic conductive film (ACF) as a circuit adhesive member 4 is described. In FIG. 1, a circuit connection structure 1A is composed of a circuit adhesive member 4 which is sandwiched between a semiconductor substrate 2 and a circuit member 3.

On a surface of the semiconductor substrate 2 are provided a heat resistant resin film 5 and many first circuit electrodes, e.g., gold electrodes. On a surface of the circuit member 3 are provided many second circuit electrodes 7 opposed to the first circuit electrodes 6. The surface of the semiconductor substrate 2 and the surface of the circuit member 3 on which these first and second circuit electrodes 6 and 7 are formed may simply be referred to as the surfaces thereof.

The semiconductor substrate 2 and the circuit member 3 are adhered via the circuit adhesive member 4. In particular, the heat resistant resin film 5 and the circuit adhesive member 4 are firmly adhered as described later. The circuit adhesive member 4 contains conductive particles 8 dispersed therein. The first circuit electrode 6 and the second circuit electrode 7 are electrically connected via the conductive particles present between the first circuit electrode 6 and the second circuit electrode 7. Meanwhile, the conductive particles 8 not present between these electrodes are dispersed in the circuit adhesive member 4. Thus, insulative property is kept in portions other than the portions between the electrodes.

As the heat resistant resin composition used for the heat resistant resin film 5 of the present invention, a copolymer of at least two selected from polyamide, polyimide, polyamideimide, polybenzoxazole, polybenzimidazole and benzocyclobutene may be used. A precursor of at least one selected from polyamide, polyimide, polyamideimide, polybenzoxazole, polybenzimidazole and benzocyclobutene may also be used. It is also possible to use polyimide and polybenzoxazole which have previously treated to give photosensitivity. For example, polyimide has a repeating unit represented by the general formula (I).

(I)

wherein W is a tetravalent organic group and R represents a bivalent organic group.

In the present invention, the circuit adhesive member 4 may be in a form of a paste or a film, and preferably in a form of an adhesive film such as ACF. This adhesive film may be made of a variety of thermoplastic materials and thermosetting materials which cure upon application of heat or light. It is preferable to apply the thermosetting material because heat resistance and moisture resistance after adhering the semiconductor substrate 2 and the circuit member 3 are excellent.

As a raw material component of the circuit adhesive member 4, an epoxy-based resin containing a potential curing agent and an acrylic resin containing a radical-based curing agent such as peroxide may be used. These are preferable because these can be cured in a short period of time and thus advantageous for adhering operation, and have excellent adhesiveness due to their molecular structure. Particularly, the epoxy-based resin is more preferable because the adhesiveness to a functional group such as an amide group (—NH—CO—) and an amino group (—NH$_2$) produced on the surface of the heat resistant resin film 5 by plasma treatment, which will be described later, is extremely enhanced.

Conductive particles and a small amount of insulative particles may be added to ACF, which is preferable because they work as a thickness keeping material upon heating and pressurizing for producing a semiconductor chip with an adhesive which is an integrated product of the semiconductor substrate 2 and the circuit adhesive member 4. The ratio of the conductive particles and the insulative particles to be added is preferably 0.1 to 30% by volume relative to ACF. To give anisotropic conductivity, it is preferable to add the conductive particles at 0.5 to 15% by volume relative to ACF.

As the conductive particles to be added to the circuit adhesive member 4, metal particles such as particles of Au, Ag, Pt, Co, Ni, Cu, W, Sb, Sn and solder as well as carbon and graphite are available. Alternatively, the conductive particles may be obtained by coating a core material with the aforementioned conductive material, wherein the core material may be either any of the aforementioned conductive material or a non-conductive macromolecule such as glass, ceramics and plastics. In addition, an insulation coating particle obtained by coating the conductive material with an insulative layer and the combination of the conductive particles with the insulative particles such as particles of glass, ceramics and plastic may also be suitably used because a resolution is enhance in positioning of the semiconductor substrate 2 and the circuit member 3 as described later. In order to assure one or more particles, preferably the particles as many as possible on the microelectrode, a particle diameter of the conductive particle is preferably as small as 15 μm or less, and preferably 1 to 7 μm.

As the semiconductor substrate 2, for example, a semiconductor element obtained by dicing a silicon wafer may be used. As the circuit member 3, a glass substrate, a metal substrate and a ceramic substrate may be used. In addition, a flexible wiring plate and a TAB tape may also be used.

Subsequently, the method for producing the circuit connection structure 1A having the aforementioned constitution will be described.

First, the heat resistant resin composition which is the raw material of the heat resistant resin film 5 is applied onto the semiconductor substrate 2 by, e.g., spin coating, and the treatment with heat is given thereto to thermally cure it. Thereby, the heat resistant resin film 5 is formed on the surface of the semiconductor substrate 2.

Subsequently, the first circuit electrode 6 is formed on the surface of the semiconductor substrate 2 on which the heat resistant resin film 5 has been formed. This first circuit electrode 6 may be formed by giving an etching treatment to the semiconductor substrate 2 to bare a metal layer previously laminated thereon, or may be formed by providing an electrode member such as a bump on the semiconductor substrate 2.

Further, the surface is modified by giving the plasma treatment to the semiconductor substrate 2 on which the heat resistant resin film 5 and the first circuit electrode 6 have been formed.

As a plasma treatment apparatus used for the plasma treatment, for example, a dry etching apparatus used for processing the semiconductor may be suitably used.

As a gas used for the plasma treatment, a nitrogen-based gas containing at least one of nitrogen, ammonia and hydrazine may be suitably used. The nitrogen-based gas herein means the gas containing a nitrogen atom for the plasma treatment. Among them, preferable is nitrogen or ammonia. When the gas other than the aforementioned is contained, it is preferable that the gas to be mixed does not contain 50% or more oxygen and fluorine hydrocarbon. Thus the gas selected from hydrogen and inert gases such as helium and argon may be mixed. More preferably, the gas may be the nitrogen-based gas consisting of at least one of nitrogen, ammonia and hydrazine, or the mixed gas consisting of these gases with hydrogen or the inert gas. The ratio of the nitrogen-based gas in the mixed gas is preferably 20 to 100% by volume. When the ratio of the nitrogen-based gas is less than 20% by volume, the surface of the semiconductor substrate 2 may not be sufficiently modified and the desired substrate adhesive performance may not be obtained, which is thus not preferable.

In order to perform the plasma treatment, the semiconductor substrate 2 on which the heat resistant resin film 5 and the first circuit electrode 6 have been formed is placed in the plasma treatment apparatus (not shown in the figure), and the nitrogen-based gas or the mixed gas is introduced into the plasma treatment apparatus. Subsequently, a high frequency wave is applied with keeping a constant pressure in the apparatus to cause plasma discharge for a certain period of time. The pressure varies depending on an apparatus form, power supply frequency and a type of the gas. The pressure in the system of the plasma treatment apparatus is preferably 0.5 Pa to a normal pressure, i.e., an atmospheric pressure. When the pressure in the system exceeds this upper limit or lower limit, the surface may not be modified because the charge may not be kept with such conditions, which is not thus preferable.

Duration for the plasma treatment may be in the range of 0.1 to 60 minutes. If a sheet-feed apparatus in which the substrate is treated one by one is used, the duration is preferably 0.5 to 5 minutes. Other conditions such as applied electric power, bias voltage and substrate temperature may be selected in accordance with publicly known methods. In order to keep a good surface state, the plasma treatment is preferably performed at a substrate bias voltage or self bias voltage of −200 V or more and 0 V or less at a substrate temperature of 0° C. or above and 200° C. or below.

Figure 2:
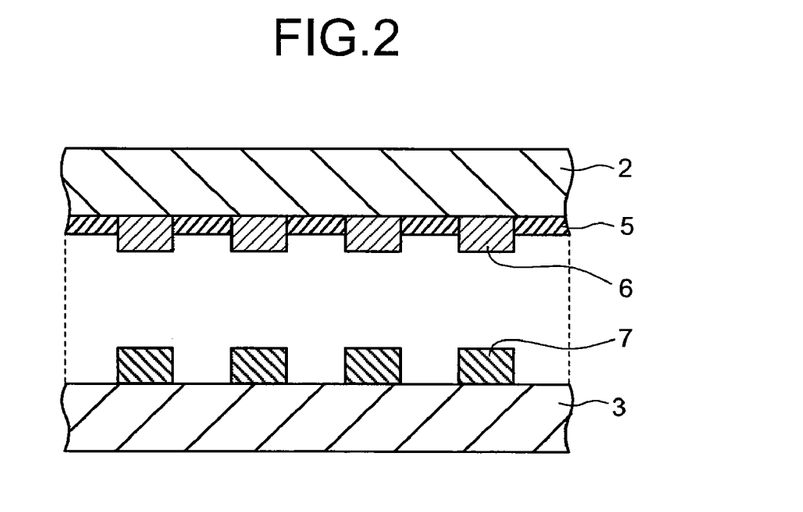
FIG. 2 is a schematic sectional view showing a semiconductor substrate and a circuit member in an opposing position.
Figure 3:
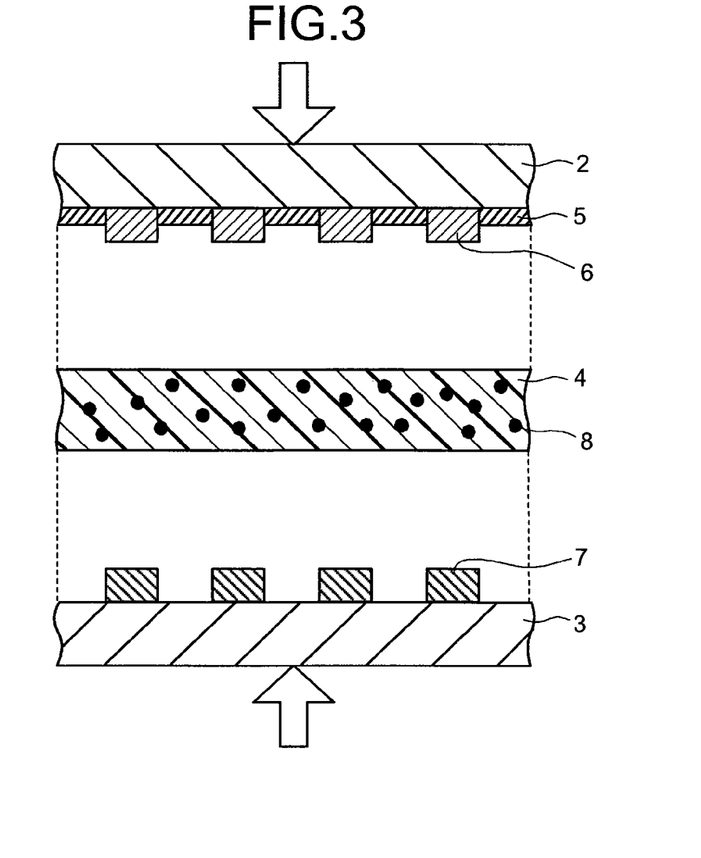
FIG. 3 is a schematic sectional view showing a circuit adhesive member (ACF) arranged between the semiconductor substrate and the circuit member.

Subsequently, as shown in FIG. 2, a circuit member 3 on whose surface many second circuit electrodes 7 to be opposed to first circuit electrodes 6 have been formed are prepared together with the semiconductor substrate 2 to which the plasma treatment has been given. Then, as shown in FIG. 3, the semiconductor substrate 2 and the circuit member 3 are positioned and opposed so that the first circuit electrodes 6 and the second circuit electrodes 7 are matched. At that time, the circuit adhesive member 4 is placed between the semiconductor substrate 2 and the circuit member 3.

Subsequently, as shown by arrows in FIG. 3, the semiconductor substrate 2 and the circuit member 3 are adhered by pressing the semiconductor substrate 2 and the circuit member 3. The semiconductor substrate 2 and the circuit member 3 may be adhered using the publicly known method. For example, the circuit adhesive member 4 is provisionally attached to the semiconductor substrate 2 or the circuit member 3, and positioning of these semiconductor substrate 2 and circuit member 3 may be performed. Then the semiconductor substrate 2 and the circuit member 3 are adhered by both heating and pressurizing, or mere pressurizing. At that time, as shown in FIG. 1, the first circuit electrode 6 and the second circuit electrode opposed each other may be electrically connected by the conductive particles 8 in the circuit adhesive member 4.

Positioning of the semiconductor substrate 2 and the circuit member 3 may be performed using a microscope or an image memory apparatus. Simultaneous use of positioning marks is effective. The aforementioned heating and pressurizing may be performed per one chip as the semiconductor substrate 2. However, if possible, simultaneous bonding with pressure of many chips would be effective for enhancing productivity. The method for adhering the heat resistant resin film 5 and the circuit adhesive member 4 according to the present invention is applicable to mounting of both a single chip or multiple chips.

As the conditions in a step of bonding ACF with pressure in the present invention, a heating temperature is preferably 100° C. or above and 260° C. or below, and more preferably 150° C. or above and 200° C. or below. A heating time is preferably one second or more and 5 minutes or less, and more preferably 5 seconds or more and 30 seconds or less. A pressure for bonding with pressure is preferably 10 MPa or more and 200 MPa or less, and more preferably 20 MPa or more and 150 MPa or less per unit area.

Concerning the adhesion of the heat resistant resin film 5 and the circuit adhesive member 4, it has been reported in Journal of IEICE (the Institute of Electronics, Information and Communication Engineers) Vol. J74-C-II, No. 6, pp 489-497 (1991) that functional groups such as amide group (—NH—CO—) and amino group (—NH$_2$) are generated by nitrogen plasma treatment. This paper discloses that, although an adhesive force between polyimide molecules is enhanced by formation of peptide bonds, the period of time during which the adhesive force sustains with the nitrogen plasma treatment is merely a half of that with the plasma of oxygen and carbon tetrafluoride. Therefore, the technology disclosed in this paper is different from the present invention since the subject to be adhered therein are polyimide molecules, and thus, the adhesive force is not kept for a long period of time.

It is generally known that an insertion reaction and an addition reaction occur between the amide group and an epoxy group when they are heated. Therefore, it is conceivable that when the semiconductor substrate 2 on whose surface has been modified by giving the plasma treatment using the aforementioned mixed gas to the surface of the heat resistant resin film 5 and the circuit adhesive member 4 are bonded with pressure and heat, new chemical bonds are formed between the amide group and the epoxy group. Thus the circuit connection structure having the adhesiveness having the high heat resistance and high reliability is thereby obtained. In addition, the good adhesiveness can be kept for a long period of time even under high temperature and high humidity.

Even when the semiconductor substrate 2 on whose surface the heat resistant resin film 5 and the first circuit electrodes 6 have been formed and subjected to the treatment with plasma is left stand for a long period of time before the step of bonding with pressure and heat, the bonding with the circuit adhesive member 4 with pressure and heat is still possible. Therefore, the semiconductor substrate 2 to which the plasma treatment has been previously given can be stored and transported, and subsequently, can be used for producing the circuit connection structure. However, it is preferable to perform the plasma treatment again with nitrogen or ammonia and heating treatment for releasing absorbed water.

In the present invention, the surface of the heat resistant resin film 5 is modified by giving the plasma treatment thereto with the nitrogen-based gas to form the functional group which contributes to improvement of the adhesiveness. However, for the purpose of removing a contaminated matter and a deteriorated layer and improving roughness on the surface of the heat resistant resin film 5, plasma treatment with another gas, e.g., oxygen or an oxygen/carbon tetrafluoride mixed gas may be performed in addition to the treatment with the nitrogen-based gas of the present invention. The subsequent plasma treatment with the nitrogen-based gas of the present invention may be performed continuously or discontinuously for the purpose of introducing a substituent effective for improving the adhesiveness. An important thing for this procedure is that the final plasma treatment of the semiconductor substrate 2 before bonding with the circuit member 3 with pressure is performed using the nitrogen-based gas.

(Embodiment 2)

Figure 4:
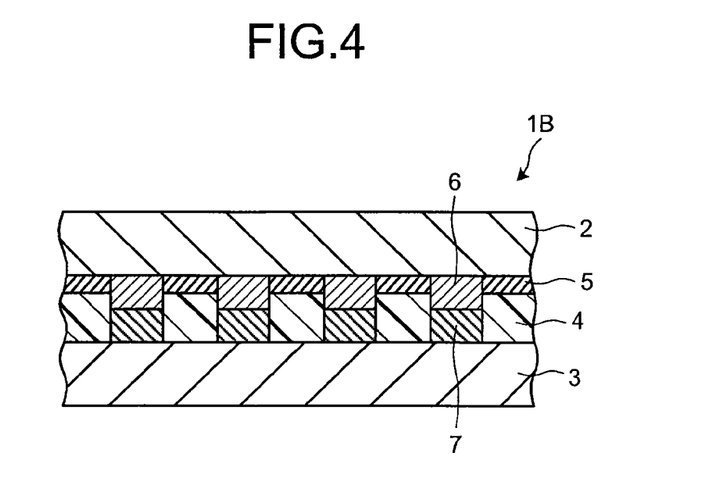
FIG. 4 is a schematic sectional view showing a circuit connection structure according to Embodiment 2 of the present invention.

FIG. 4 is a schematic sectional view of the circuit connection structure according to Embodiment 2 of the present invention. In Embodiment 2, the non-conductive film (NCF) is used as the circuit adhesive member 4. As to other materials and method, the same ones as in Embodiment 1 are applicable. Thus, overlapped descriptions are omitted.

In FIG. 4, the circuit connection structure is composed by sandwiching the circuit adhesive member 4 between the semiconductor substrate 2 and the circuit member 3. The circuit adhesive member 4 contains no conductive particle. The semiconductor substrate 2 comprises the heat resistant resin film 5 on the surface, and many first circuit electrodes, e.g., gold electrodes are formed thereon. Many second circuit electrodes 7 opposed to the first circuit electrodes 6 are formed on the surface of the circuit member 3.

The semiconductor substrate 2 and the circuit member 3 are adhered through the circuit adhesive member 4. The first circuit electrode 6 and the second circuit electrode 7 are electrically connected by mutually contacting directly. These first circuit electrode 6 and second circuit electrode 7 may be a bump such as gold electrode, as well as a solder or a bonding wire whose tip has been cut.

Subsequently, the method for producing the circuit connection structure 1B constituted as described above will be described.

Figure 5:
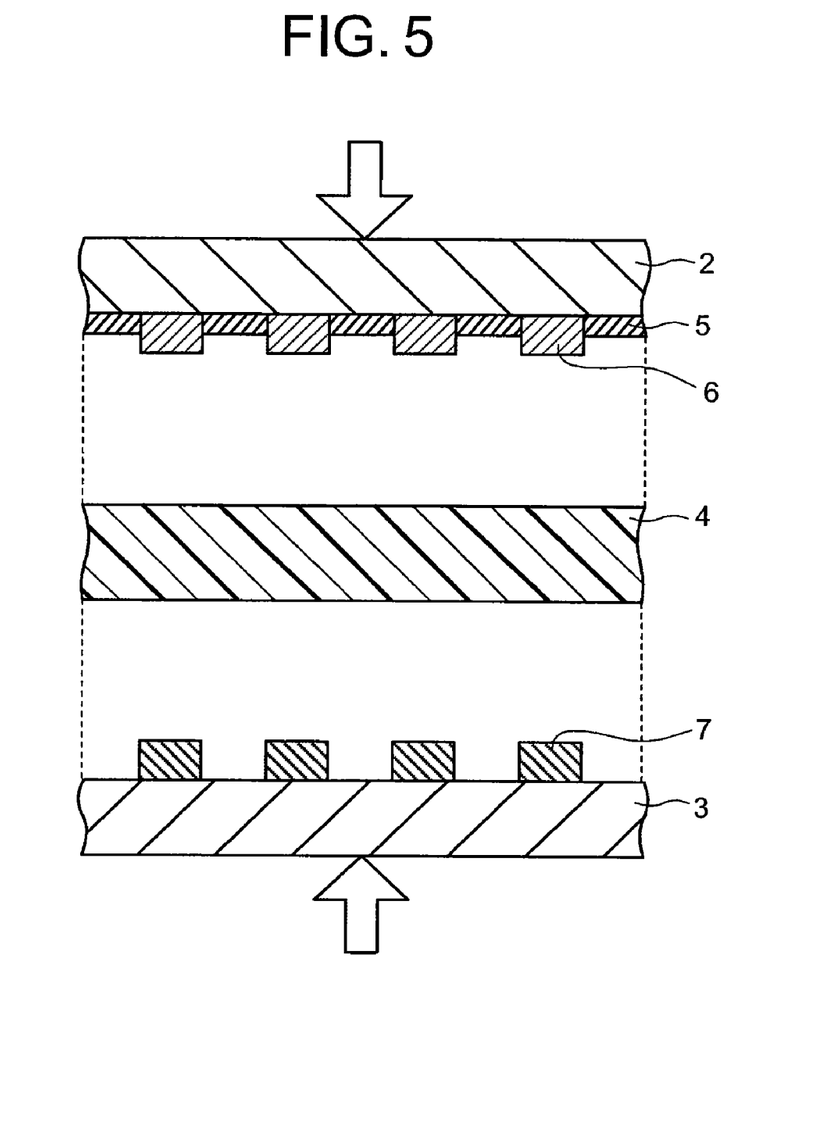
FIG. 5 is a schematic sectional view showing a circuit adhesive member (NCF) arranged between the semiconductor substrate and the circuit member.

As shown in FIG. 2, the semiconductor substrate 2 to which the plasma treatment has been given in the same manner as in Embodiment 1 and the circuit member 3 on whose surface many second circuit electrodes 7 to be opposed to the first circuit electrodes 6 have been formed are prepared. Then, as shown in FIG. 5, the semiconductor substrate 2 and the circuit member 3 are positioned in an opposed manner so that the first circuit electrodes 6 and the second circuit electrodes 7 are matched. At that time, the circuit adhesive member 4 is placed between the semiconductor substrate 2 and the circuit member 3.

Subsequently, as shown by arrows in FIG. 5, the semiconductor substrate 2 and the circuit member 3 are bonded with pressure with sandwiching the circuit adhesive member 4. This bonding with pressure may be performed in the same manner as in Embodiment 1. As shown in FIG. 4, the semiconductor substrate 2 and the circuit member 3 are mechanically adhered by pressing the semiconductor substrate 2 and the circuit member 3, and the first circuit electrodes 6 and the second circuit electrodes 7 are electrically connected by directly contacting each another.

This way, it is possible to produce the circuit connection structure 1B which can keep the good adhesiveness for a long period of time even under the high temperature and high humidity.

EXAMPLES

The present invention will be more specifically described below with reference to Examples and Comparative Examples. The present invention is not limited by the following Examples.

Example 1

[1] (Synthesis Example 1) Preparation of Polyimide Precursor Varnish

In a four-necked separable flask equipped with a thermometer, a stirring device, a cooling tube and a nitrogen introducing tube, 20.02 g (0.1 mol) of 4,4'-diaminodiphenyl ether was dissolved in 289.2 g of N-methyl-2-pyrrolidone. Then 31.02 g (0.1 mol) of pyromellitic dianhydride was added thereto, and the mixture was stirred at room temperature for 6 hours. Subsequently, a viscosity was adjusted, to yield 15% by weight of a polyimide precursor varnish.

The resulting polyimide precursor was diluted with an N-methyl-2-pyrrolidone solution containing γ-aminopropyltriethoxysilane at 1% by weight relative to the resin, to yield 13% by weight of the polyimide precursor varnish, which was then filtrated with pressure through a Teflon (registered trade name) filter having 1 μm pores, to yield the polyimide precursor varnish.

[2] Preparation of Polyimide Film

The polyimide precursor varnish as the heat resistant resin film obtained in Synthesis Example 1 was spin-coated on a 5-inch silicon wafer as a semiconductor substrate. The treatment with heat was given thereto on a hotplate at 130° C. for 2 minutes, and using a diffusion furnace under the nitrogen atmosphere at 200° C. for 30 minutes and 350° C. for 60 minutes, to yield a silicon substrate (X) with a polyimide (α) film having a film thickness of 5 μm.

[3] Plasma Treatment

The resulting silicon substrate (X) with the polyimide (α) film was treated with nitrogen at a total flow of 25 cc/minute at a pressure of 10 Pa and at high frequency electric power of 100 W for 2 minutes using CSE-1110 sheet-feed plasma etching apparatus supplied from Nippon Shinku Gijutsu K.K. The resulting silicon substrate with the polyimide film treated with nitrogen plasma was cut into 1 cm squares by a dicer with a diamond cutter to obtain lower layer chips for evaluating the adhesiveness.

[4] Circuit Adhesive Member

An ACF material containing phenoxy resin (high molecular weight epoxy resin) AC-8408 supplied from Hitachi Chemical Co., Ltd. was cut to yield a tape-shaped member having a width of 2 mm.

[5] Bonding with Pressure

As an upper layer chip for evaluating the adhesiveness, an IC chip of a silicon substrate of 2×10 mm having a thickness of 0.5 mm, equipped with 300 bumps, i.e., gold electrodes each having 50 μmφ and a height of 20 μm on two longitudinal sides of the substrate was prepared. The ACF material AC-8408 was sandwiched with this upper layer chip for adhesiveness evaluation and the aforementioned lower layer chip treated with the nitrogen plasma. The bonding with pressure and heat for 10 seconds was performed by setting the heating temperature at 160° C., and at 50 MPa per total electrode area, to yield an electrode semiconductor substrate for the evaluation.

[6] Evaluation

The resulting electrode semiconductor substrate for the evaluation was subjected to a pressure cooker tester at 121° C., at 2 atm and at 100% RH for 24 or 48 hours. The evaluation was performed by placing the sample together with an untreated sample on a stage at 260° C. and, after 30 seconds, performing a shearing treatment using DAGE 4000 Multipurpose Bondtester, for comparing the adhesion strength and a destruction mode. The results are shown in Table 1 together with the results of the untreated sample in the pressure cooker test.

Example 2

[1] (Synthesis Example 2) Preparation of Polyimide Precursor Varnish

In a four-necked separable flask equipped with a thermometer, a stirring device, a cooling tube and a nitrogen introducing tube, 18.02 g (0.09 mol) of 4,4'-diaminodiphenyl ether and 2.49 g (0.01 mol) of 1,3-bis(3-aminopropyl)-1,1,1-tetramethyldisiloxane were dissolved in 270.0 g of N-methyl-2-pyrrolidone. Further 6.54 g (0.03 mol) of pyromellitic dianhydride and 20.60 g (0.07 mol) of 3,3',4,4'-biphenyltetracarboxylic dianhydride were added thereto, and the mixture was stirred at room temperature for 6 hours. Subsequently, the viscosity was adjusted, and the mixture was further filtrated with pressure through the Teflon (registered trade name) filter having 1 μm pores, to yield 15% by weight of a polyimide precursor varnish.

[2] Preparation of Polyimide Film

The polyimide precursor varnish as the heat resistant resin film obtained in Synthesis Example 2 was spin-coated on a 5-inch silicon wafer as a semiconductor substrate. The treatment with heat was given thereto on a hotplate at 130° C. for 2 minutes, and using a diffusion furnace under the nitrogen atmosphere at 200° C. for 30 minutes and 350° C. for 60 minutes, to yield a silicon substrate (Y) with a polyimide (β) film having a film thickness of 5 μm.

[3] Plasma Treatment

The resulting silicon substrate (Y) with the polyimide (β) film was treated with nitrogen at a total flow of 25 cc/minute at a pressure of 10 Pa and at high frequency electric power of 100 W for 2 minutes using CSE-1110 sheet-feed plasma etching apparatus supplied from Nippon Shinku Gijutsu K.K. The resulting silicon substrate with the polyimide film treated with the nitrogen plasma was cut into 1 cm squares by a dicer with a diamond cutter to obtain lower layer chips for evaluating the adhesiveness.

[4] Circuit Adhesive Member

The ACF material mm AC-8408 supplied from Hitachi Chemical Co., Ltd. having a width of 2 was used in the same manner as in Example 1.

[5] Bonding with Pressure

In the similar manner to Example 1, the ACF material AC-8408 was sandwiched between the IC chip for the evaluation as the upper layer chip for evaluating the adhesiveness and the aforementioned silicon substrate with the polyimide film (β) treated with the nitrogen plasma as the lower layer chip. The bonding with pressure and heat was then performed for 10 seconds by setting the heating temperature at 160° C. and at 50 MPa per total electrode area, to yield an electrode semiconductor substrate for the evaluation.

[6] Evaluation

In the similar manner to Example 1, the evaluation was performed by placing the resulting electrode semiconductor substrate for the evaluation together with an untreated sample in the pressure cooker tester at 121° C., at 2 atm and at 100% RH for 24 or 48 hours and comparing the adhesion strength and the destruction mode at 260° C. using DAGE 4000 Multipurpose Bondtester.

Example 3

[1] (Synthesis Example 3) Preparation of Polybenzoxazole Precursor Varnish
Synthesis of Polybenzoxazole Precursor In a 0.5 liter flask equipped with a stirrer and a thermometer, 21.7 g (0.084 mol) of 4,4'-dicarboxyldiphenyl ether and 125.0 g of N-methylpyrrolidone were placed. The flask was cooled to 0° C., and 20.0 g (0.168 mol) of thionyl chloride was added dropwise with keeping a reaction temperature at 10° C. or below. After completing addition of thionyl chloride, the mixture was stirred at around 10° C. for 30 minutes, to yield a dichloride solution of 4,4'-dicarboxyldiphenyl ether.

In a four-necked separable flask equipped with a thermometer, a stirring device, a cooling tube and a nitrogen introducing tube, 100 g of N-methylpyrrolidone was placed. Then 37.0 g (0.10 mol) of 2,2-bis(3-amino-4-hydroxyphenyl)-1,1,1,3,3,3-hexafluoropropane was added, stirred and dissolved. Then 26.6 g of pyridine was added thereto, and this solution was cooled. With keeping the temperature at 0 to 10° C., a solution of 1,4-dicarboxycyclohexane dichloride was added dropwise over 30 minutes. Then the solution was stirred at around 10° C. for 30 minutes. The reaction solution was poured in 4 liters of water. A precipitate was collected, washed, and dried under reduce pressure at 40° C. for two days, to yield polyhydroxyamide.

15.0 g of the aforementioned polyhydroxyamide was dissolved in 22.5 g of an N-methyl-2-pyrrolidone solution in which γ-aminopropyltriethoxysilane at 1% by weight relative to the resin had been dissolved, and the resulting solution was filtrated with pressure through the Teflon (registered trade name) filter having 1 μm pores, to yield 40% by weight of a polybenzoxazole precursor varnish.

[2] Preparation of Polybenzoxazole Film

The polybenzoxazole precursor varnish as the heat resistant resin film obtained in Synthesis Example 3 was spin-coated on a 5-inch silicon wafer as a semiconductor substrate, and the treatment with heat was given thereto on a hotplate at 120° C. for 2 minutes, and using a diffusion furnace under the nitrogen atmosphere at 200° C. for 30 minutes and 320° C. for 60 minutes, to yield a silicon substrate (Z) with a polybenzoxazole (γ) film having a film thickness of 5 μm.

[3] Plasma Treatment

The resulting silicon substrate (Z) with the polybenzoxazole (γ) film was treated with nitrogen at a total flow of 25 cc/minute at a pressure of 10 Pa at high frequency electric power of 100 W for 2 minutes using CSE-1110 sheet-feed plasma etching apparatus supplied from Nippon Shinku Gijutsu K.K. The resulting silicon substrate with the polybenzoxazole film treated with the nitrogen plasma was cut into 1 cm squares by a dicer with a diamond cutter to obtain lower layer chips for evaluating the adhesiveness.

[4] Circuit Adhesive Member

The ACF material AC-8408 supplied from Hitachi Chemical Co., Ltd. having a width of 2 mm was used in the same manner as in Example 1.

[5] Bonding with Pressure

In the similar manner to Example 1, the ACF material AC-8408 was sandwiched between the IC chip for the evaluation as the upper layer chip for evaluating the adhesiveness and the aforementioned silicon substrate (Z) treated with the nitrogen plasma as the lower layer chip. This constitution was bonded with pressure and heat for 10 seconds by setting the heating temperature at 160° C., and at 50 MPa per total electrode area, to yield an electrode semiconductor substrate for the evaluation.

[6] Evaluation

In the similar manner to Example 1, the evaluation was performed by placing the resulting electrode semiconductor substrate for the evaluation together with an untreated sample in the pressure cooker tester at 121° C., at 2 atm and at 100% RH for 24 or 48 hours and comparing the adhesion strength and the destruction mode using DAGE 4000 Multi-purpose Bondtester. The results are shown in Table 1.

Comparative Example 1

[5] Bonding with Pressure

The silicon substrate (X) with the polyimide (α) film having a film thickness of 5 μm obtained in Example 1 was used as the lower layer chip without giving the plasma treatment. The IC chip for the evaluation was used as the upper chip for evaluating the adhesiveness, and the ACF material AC-8408 supplied from Hitachi Chemical Co., Ltd. having a width of 2 mm was used as the adhesive film. This constitution was bonded with pressure and heat for 10 seconds by setting the heating temperature at 160° C., and at 50 MPa per total electrode area, to yield an electrode semiconductor substrate for the evaluation.

[6] Evaluation

In the similar manner to Example 1, the evaluation was performed by placing the resulting electrode semiconductor substrate for the evaluation together with an untreated sample in the pressure cooker tester at 121° C., at 2 atm and at 100% RH for 24 or 48 hours and comparing the adhesion strength and the destruction mode using DAGE 4000 Multi-purpose Bondtester. The results are shown in Table 1.

Comparative Example 2

[3] Plasma Treatment

The silicon substrate (X) with the polyimide (α) film having a film thickness of 5 μm obtained in Example 1 was treated with oxygen at total flow of 100 cc/minute at a pressure of 100 Pa at high frequency electric power of 400 W for 2 minutes using PC101A oxygen plasma apparatus supplied from Yamato Chemical Industry Co., Ltd. The resulting silicon substrate with the polyimide film treated with the oxygen plasma was cut into 1 cm squares by a dicer with a diamond cutter to obtain lower layer chips for evaluating the adhesiveness.

[5] Bonding with Pressure

The IC chip for the evaluation was used as the upper layer chip for evaluating the adhesiveness. The silicon substrate (X) treated with the oxygen plasma was used as the lower layer chip. The ACF material AC-8408 supplied from Hitachi Chemical Co., Ltd. having a width of 2 mm was used as the adhesive film. This constitution was bonded with pressure and heat for 10 seconds by setting the heating temperature at 160° C., and at 50 MPa per total electrode area, to yield an electrode semiconductor substrate for the evaluation.

[6] Evaluation

In the similar manner to Example 1, the evaluation was performed by placing the resulting electrode semiconductor substrate for the evaluation together with an untreated sample in the pressure cooker tester at 121° C., at 2 atm and at 100% RH for 24 or 48 hours and comparing the adhesion strength and the destruction mode using DAGE 4000 Multi-purpose Bondtester. The results are shown in Table 1.

Comparative Example 3

[3] Plasma Treatment

The resulting silicon substrate (X) with the polyimide ($\alpha$) film was treated with methane tetrafluoride at a total flow of 25 cc/minute at a pressure of 10 Pa at high frequency electric power of 100 W for 2 minutes using CSE-1110 sheet-feed plasma etching apparatus supplied from Nippon Shinku Gijutsu K.K. The resulting silicon substrate with the polyimide film treated with methane tetrafluoride plasma was cut into 1 cm squares by a dicer with a diamond cutter to obtain lower layer chips for evaluating the adhesiveness.

[5] Bonding with Pressure

The IC chip for the evaluation was used as the upper layer chip for evaluating the adhesiveness. The silicon substrate (X) treated with the methane tetrafluoride plasma was used as the lower layer chip. The ACF material AC-8408 supplied from Hitachi Chemical Co., Ltd. having a width of 2 mm was used as the adhesive film. This constitution was bonded with pressure and heat for 10 seconds by setting the heating temperature at 160° C. and at 50 MPa per total electrode area, to yield an electrode semiconductor substrate for the evaluation.

[6] Evaluation

In the similar manner to Example 1, the evaluation was performed by placing the resulting electrode semiconductor substrate for the evaluation together with an untreated sample in the pressure cooker tester at 121° C., at 2 atm and at 100% RH for 24 or 48 hours and comparing the adhesion strength and the destruction mode using DAGE 4000 Multi-purpose Bondtester. The results are shown in Table 1.

The results of the evaluations in the aforementioned Examples 1 to 3 and Comparative Examples 1 to 3 are collectively shown in Table 1.

TABLE 1

| | Type of heat resistant resin film | Type of gas (% by volume) | Initial value | | 24 hours after placing at 121° C. and at 100% RH | | 48 hours after placing at 121° C. and at 100% RH | |
|---|---|---|---|---|---|---|---|---|
| | | | Adhesion strength (MPa) | Destruction mode | Adhesion strength (MPa) | Destruction mode | Adhesion strength (MPa) | Destruction mode |
| Ex. 1 | Polyimide ($\alpha$) | Nitrogen 100 | 3.5 | Cohesion failure of ACF | 3.7 | Cohesion failure of ACF | 4.4 | Cohesion failure of ACF |
| Ex. 2 | Polyimide ($\beta$) | Nitrogen 100 | 4.5 | Cohesion failure of ACF | 4.5 | Cohesion failure of ACF | 4.6 | Cohesion failure of ACF |
| Ex. 3 | Polybenzoxazole ($\gamma$) | Nitrogen 100 | 4.1 | Cohesion failure of ACF | 3.9 | Cohesion failure of ACF | 3.9 | Cohesion failure of ACF |
| Comp. Ex. 1 | Polyimide ($\alpha$) | Untreated | 3.7 | Cohesion failure of ACF | 1.1 | Interfacial delamination between PI* and ACF | 0.0 | Interfacial delamination between PI* and ACF |
| Comp. Ex. 2 | Polyimide ($\alpha$) | Oxygen 100 | 5.8 | Cohesion failure of ACF | 2.3 | Interfacial delamination between PI* and ACF | 1.6 | Interfacial delamination between PI* and ACF |
| Comp. Ex. 3 | Polyimide ($\alpha$) | Methane tetrafluoride 100 | 3.5 | Cohesion failure of ACF | 1.3 | Interfacial delamination between PI* and ACF | 0.0 | Interfacial delamination between PI* and ACF |

PI*: Polyimide ($\alpha$)

As is evident from Table 1, similar levels of the adhesion strength to the initial values were kept after placing the electrode semiconductor substrate for the evaluation in the pressure cooker tester for 24 hours or 48 hours in Examples 1 to 3. The destruction mode in the evaluation of the adhesion strength was the destruction of ACF itself, and the adhesion between ACF and the heat resistant resin film was kept. On the contrary, the adhesion strength was remarkably reduced after placing the electrode semiconductor substrate for the evaluation in the pressure cooker tester for 24 hours or 48 hours in Comparative Examples 1 to 3. In the destruction mode in the evaluation of the adhesion strength, the delamination in the interface between polyimide (α) and ACF occurred before the cohesion failure of ACF occurred. Therefore, it has been found that the high adhesion strength can be kept for a long period of time in the circuit connection structure of the present invention.

Industrial Applicability

As in the above, the circuit connection structure and the method for producing the same and the semiconductor substrate for the circuit connection structure according to the present invention are useful for various small semiconductor products, and particularly suitable for vehicle-mounted semiconductor products and vehicle-mounted liquid crystal displays used under the high temperature and high humidity because the good adhesiveness can be kept for a long period of time even under the high temperature and high humidity and the circuit connection structure having the high reliability is obtained.

The invention claimed is:

1. A method for producing a circuit connection structure comprising the steps of:
   (a) modifying a surface of a semiconductor substrate on which a heat resistant resin film and a first circuit electrode are disposed, by giving a plasma treatment to the semiconductor substrate, using a nitrogen-based gas containing at least one component selected from the group consisting of nitrogen, ammonia and hydrazine, wherein the plasma treatment produces an amide group or an amino group on a surface of the heat resistant resin film;
   (b) arranging the semiconductor substrate whose surface has been modified and a circuit member having a second circuit electrode to be opposed to the first circuit electrode so that the first circuit electrode is opposed to the second circuit electrode with a circuit adhesive member interposed therebetween, wherein the circuit adhesive member is an adhesive film or an adhesive paste that contains a component selected from the group consisting of an epoxy-based resin and an acrylic resin; and
   (c) bonding the semiconductor substrate and the circuit member with pressure to adhere the semiconductor substrate and the circuit member for establishing mutual electrical connection between the first circuit electrode and the second circuit electrode, wherein the heat resistant resin film is a film comprising:
      i. a polymer of at least one component selected from the group consisting of polyamide, polyimide, polyamideimide, polybenzoxazole, polybenzimidazole and benzocyclobutene; or
      ii. a copolymer of at least two components selected from the group consisting of polyamide, polyimide, polyamideimide, polybenzoxazole, polybenzimidazole and benzocyclobutene; or
      iii. at least one precursor of the polymer.

2. The method for producing the circuit connection structure according to claim 1, wherein said circuit adhesive member comprises conductive particles and said first circuit electrode and said second circuit electrode are connected electrically through said conductive particles.

3. The method for producing the circuit connection structure according to claim 1, wherein in place of said nitrogen-based gas a mixed gas is used, wherein the mixed gas comprises said nitrogen-based gas and hydrogen or an inert gas.

4. The method for producing the circuit connection structure according to claim 3, wherein a ratio of said nitrogen-based gas is 20 to 100% by volume relative to said mixed gas.

5. The method for producing the circuit connection structure according to claim 1, wherein said heat resistant resin film comprises the copolymer, or the at least one precursor of the polymer.

6. The method for producing the circuit connection structure according to claim 1, wherein said plasma treatment is performed at a pressure in the range of 0.5 Pa to normal pressure.

7. The method for producing the circuit connection structure according to claim 1, wherein said semiconductor substrate is a semiconductor device.

8. The method for producing the circuit connection structure according to claim 1, wherein said circuit member is a glass substrate, a metal substrate or a ceramic substrate.

9. The method for producing the circuit connection structure according to claim 1, wherein the plasma treatment is performed at the range of bias voltage of −200 V or more and 0 V or less, and wherein the plasma treatment is performed at the range of temperature of 0° C. or above and 200° C. or below.

10. The method for producing the circuit connection structure according to claim 1, wherein the heat resistant resin film comprises the polymer, and the polymer is selected from the group consisting of polyimide and polybenzoxazole.

* * * * *